United States Patent
Goldentouch et al.

(10) Patent No.: US 10,616,561 B2
(45) Date of Patent: Apr. 7, 2020

(54) METHOD AND APPARATUS FOR GENERATING A 3-D IMAGE

(71) Applicant: INUITIVE LTD., Ra'anana (IL)

(72) Inventors: Lev Goldentouch, Rishon Lezion (IL); Chagai Ensenberg, Zur-Yigal (IL)

(73) Assignee: INUITIVE LTD., Ra'anana (IL)

( * ) Notice: Subject to any disclaimer, the term of this patent is extended or adjusted under 35 U.S.C. 154(b) by 283 days.

(21) Appl. No.: 15/257,166

(22) Filed: Sep. 6, 2016

(65) Prior Publication Data

US 2017/0070726 A1  Mar. 9, 2017

Related U.S. Application Data (60) Provisional application No. 62/213,639, filed on Sep. 3, 2015.

(51) Int. Cl.

| H04N 13/254 | (2018.01) |
| G06T 7/521 | (2017.01) |
| G06T 7/593 | (2017.01) |
| H01S 5/42 | (2006.01) |
| H04N 13/25 | (2018.01) |
| H04N 13/257 | (2018.01) |
| H01S 5/042 | (2006.01) |

(52) U.S. Cl.
CPC .......... *H04N 13/254* (2018.05); *G06T 7/521* (2017.01); *G06T 7/593* (2017.01); *H04N 13/25* (2018.05); *H04N 13/257* (2018.05); *H01S 5/042* (2013.01); *H01S 5/423* (2013.01)

(58) Field of Classification Search
CPC ....... G06T 7/521; G06T 7/593; H04N 13/254; H04N 13/257; H04N 13/25
See application file for complete search history.

(56) References Cited

U.S. PATENT DOCUMENTS

| 9,443,310 | B2 * | 9/2016 | Hudman | G01S 17/89 |
| 2014/0240464 | A1 * | 8/2014 | Lee | G01S 17/08 348/47 |
| 2015/0097947 | A1 * | 4/2015 | Hudman | G01S 17/89 348/136 |
| 2015/0341619 | A1 * | 11/2015 | Meir | G01S 17/06 348/47 |
| 2016/0044298 | A1 * | 2/2016 | Holz | H04N 5/332 348/47 |
| 2016/0150219 | A1 * | 5/2016 | Gordon | G01B 11/2513 348/46 |
| 2016/0223828 | A1 * | 8/2016 | Abraham | G01C 3/02 |
| 2016/0307325 | A1 * | 10/2016 | Wang | G01B 11/22 |
| 2016/0307326 | A1 * | 10/2016 | Wang | G01B 11/22 |
| 2017/0188016 | A1 * | 6/2017 | Hudman | G01S 17/89 |
| 2017/0228036 | A1 * | 8/2017 | Klein | G06F 3/017 |

* cited by examiner

*Primary Examiner* — Christopher S Kelley
*Assistant Examiner* — Boubacar Abdou Tchoussou
(74) *Attorney, Agent, or Firm* — Browdy and Neimark, PLLC (57) ABSTRACT

A method and apparatus are provided for generating a three dimensional image, wherein the method includes: illuminating a target; capturing an image that comprises an object present at the illuminated target; converting the captured image into data and processing it to determine depth of the object; and generating a three dimensional image of the object whose depth has been determined. Preferably, the illumination intensity applied while illuminating the target, is determined based on the current intensity of ambient light at the target.

16 Claims, 10 Drawing Sheets

METHOD AND APPARATUS FOR GENERATING A 3-D IMAGE

CROSS-REFERENCE TO RELATED APPLICATIONS

This application claims priority of U.S. Provisional Patent Application No. 62/213,639, filed Sep. 3, 2015, the disclosure of which is incorporated by reference herein in its entirety.

TECHNICAL FIELD

The present disclosure generally relates to methods for using optical devices, and more particularly, to methods for determining depth for generating a three dimensional image of an object.

BACKGROUND

The present disclosure relates to active systems having global shutter sensor, for example a CCD sensor having a global shutter. The term "CCD" stands for Charge Coupled Device, and the pixels in a CCD store their charge until it has been depleted. A camera that has a CCD sensor almost always has also a shutter system, which can be electronic or mechanical. While this shutter system is "closed" (or "off"), the pixels can still be read because they store their charges. However, when the shutter is open, the sensor collects light, and after the shutter closes, the AFE ("Analog Front End") reads the pixel charges one by one, dumps any excess charge, and gets the pixels ready for the next frame. In other words, the CCD captures the entire image at the same time and then reads the information after the capture is completed, rather than reading top to bottom during the exposure. Because it captures everything at once, the shutter is considered to be a "global" one. The result is an image with no motion artifacts. CCD sensors are double layered and are adapted to transfer their charges from one layer to the next before the read out is conducted.

An active system that determines depth from stereoscopic images, uses projected pattern generated by projector light source (such as a laser, a LED, a VCSEL or any similar device). In addition to the projected pattern, a measurement is conducted of observable light emitted by other sources. For example, ambient light derived from the sun or from room illumination, stray light generated as a side effect of the projector light source operation, backlight generated by a secondary controlled light source such as LED, and the like.

In order to take ambient light into consideration, it may be measured and the power of the projector/LED be modified accordingly. Alternatively, the exposure value may be set up by a user who determines an illumination profile.

The projector light source is efficient when operating under a certain range of currents, and dictates the voltage value, optical power and efficiency. Typically, the operation of a light source is efficient when the light source operates under relatively high surge current for short pulses, or when the light source operates under lower current for longer pulses, due to heating.

The projector light source may behave differently under different illumination conditions. Under intense ambient light conditions, it would make sense to generate short high power pulses, so that the projected pattern is visible at the object. On the other hand, under moderate ambient light conditions it would make sense to generate longer and weaker pulses, in order to maximize the light source efficiency as well as the available ambient light. Yet, in the absence of ambient light, it would make sense to utilize still longer pulses and a secondary light source, in order to obtain scattered light upon the object. In addition, it should be noted that the projected pattern contrast, may shift the working points.

The power provided to the projector light source needs preferably to be such that it is able to meet several requirements, among which: pulse shape and power, energy efficiency, nominal input voltage, maximal input current, low physical size and cost.

Two standard methods of providing projector power are known in the art. The first, using DC to DC converter circuits and the second, using switch capacitor voltage and current sources. In both these methods, the size and cost of the circuitry involved in order to drive effectively the projected pattern and the secondary light source, are quite limiting factors.

SUMMARY OF THE DISCLOSURE

The disclosure may be summarized by referring to the appended claims.

It is an object of the present disclosure to provide a method and an apparatus for generating a three dimensional image of an object which is present at a target area.

It is another object of the present disclosure to provide a method and an apparatus for generating a three dimensional image of an object by illuminating the target area at which the object is present.

It is another object of the present disclosure to provide a method and an apparatus for generating a three dimensional image of an object by illuminating the target area at which the object is present, and wherein the illumination is carried out by taking into account the ambient light conditions at the target area.

Other objects of the present invention will become apparent from the following description.

According to a first embodiment of the disclosure, there is provided a method for generating a three dimensional image, comprising the steps of:
  (i) illuminating a target (i.e. at least one part of the target area);
  (ii) capturing an image that comprises one or more objects present at the illuminated target;
  (iii) converting the captured image into data;
  (iv) processing the data received from the conversion of the captured image;
  (v) determining depth of at least one of the one or more objects present at the illuminated target; and
  (vi) generating a three dimensional image of the at least one of the one or more objects whose depth has been determined.

It should be noted that the terms "target" and "target area" are both used herein throughout the description and claims to denote an area which is illuminated in accordance with certain embodiments of the present disclosure.

According to another embodiment, the step of illuminating a target comprises projecting light at a pre-defined pattern onto the target.

In accordance with another embodiment, the projected light is emitted from a VSCEL array and its pattern is formed by at least one diffractive optical element.

According to yet another embodiment, the illumination intensity applied while illuminating the target, is determined based on current intensity of ambient light at the target.

By still another embodiment, the step of capturing the image of the one or more objects comprised in the illuminated target, comprises retrieving the image by at least one depth capturing sensor (e.g. a camera) and at least one RGB sensor (e.g. a camera), and wherein the step of processing the retrieved data relates to data retrieved from the at least two sensors.

The term an "RGB sensor" is used herein throughout the specification and claims to denote a sensor (e.g. a camera) that delivers the three basic color components (red, green, and blue) on three different wires. This type of camera often uses three independent CCD sensors to acquire the three color signals. RGB cameras are typically used for very accurate color image acquisitions.

According to another embodiment, the method further comprising a step of capturing at least one other image (a second image) of the at least one object associated with the preceding three dimensional image (a first image) that was generated, and determining whether a change had occurred to that at least one object within a period of time extending between the time at which the first image was captured and the time at which the at least one other (second) image was captured.

In accordance with another embodiment, the method further comprising a step of retrieving audio information emanating at the target vicinity.

By yet another embodiment, the method further comprising repeating steps (ii) to (iv) and determining a movement of the at least one of the one or more objects whose depth has been determined, by combining information derived from at least two captured images and the retrieved audio information emanating at the target vicinity.

According to another aspect of the disclosure, an apparatus is provided, wherein the apparatus is configured to provide a three dimensional image of at least one object, and comprising:

a projector configured to illuminate a target area where the at least one object is present;

at least one image capturing sensor, configured to capture an image that comprises the at least one object, by receiving light reflected from the at least one object; and at least one processor configured to process data retrieved from the image captured by the at least one image capturing sensor and to generate a three dimensional image that comprises the at least one object.

According to still another embodiment of this aspect, the projector comprises a VCSEL array.

By yet another embodiment, the apparatus further comprises a diffractive optical element for providing a pre-defined pattern of the light emitted from the projector.

In accordance with another embodiment, the pre-defined pattern is a pattern that enables a three dimensional imaging of the at least one object, e.g. by implementing a structured light technique. A structured light technique is a process of projecting a known pattern (often grids or horizontal bars) onto a target. The way that this pattern is deformed when light strikes a surface, allows vision systems to calculate the depth and surface information of the objects at the target.

Invisible structured light technique uses structured light without interfering with other computer vision tasks for which the projected pattern will be confusing. For example, by using infrared light or of extremely high frame rates alternating between two exact opposite patterns.

According to another embodiment, the illumination intensity of the projector applied while illuminating the target, is determined based on current intensity of ambient light at the target area. This functionality, may be obtained for example by using a simple capacitor-based circuit configured to shape the illumination profile of light emitted by the projector for various ambient light values based on exposure setting. Optionally, the apparatus is adapted to enable switching between several light sources based on the image properties (and if a motion detection is required).

According to still another embodiment, the apparatus comprises at least one depth capturing sensor and at least one RGB sensor, and wherein the processor is configured to process data retrieved from the at least two sensors, for generating the three dimensional image.

In accordance with yet another embodiment, the apparatus further comprising a microphone configured to capture audio information emanating at the target vicinity.

BRIEF DESCRIPTION OF THE DRAWING

For a more complete understanding of the present invention, reference is now made to the following detailed description taken in conjunction with the accompanying drawing wherein.

DETAILED DESCRIPTION

In this disclosure, the term "comprising" is intended to have an open-ended meaning so that when a first element is stated as comprising a second element, the first element may also include one or more other elements that are not necessarily identified or described herein, or recited in the claims.

In the following description, for the purposes of explanation, numerous specific details are set forth in order to provide a better understanding of the present invention by way of examples. It should be apparent, however, that the present invention may be practiced without these specific details.

In addition, in the following description the term "reference sensor" should be understood as a sensor to which the disparity image is attributed, e.g., the right sensor or the left sensor. However, it should be understood by those skilled in the art, that a reference sensor may alternatively be a virtual reference sensor, generated by interpolating or extrapolating disparities that are visible by the left and right sensors, while filling in missing occlusion data.

Figure 1:
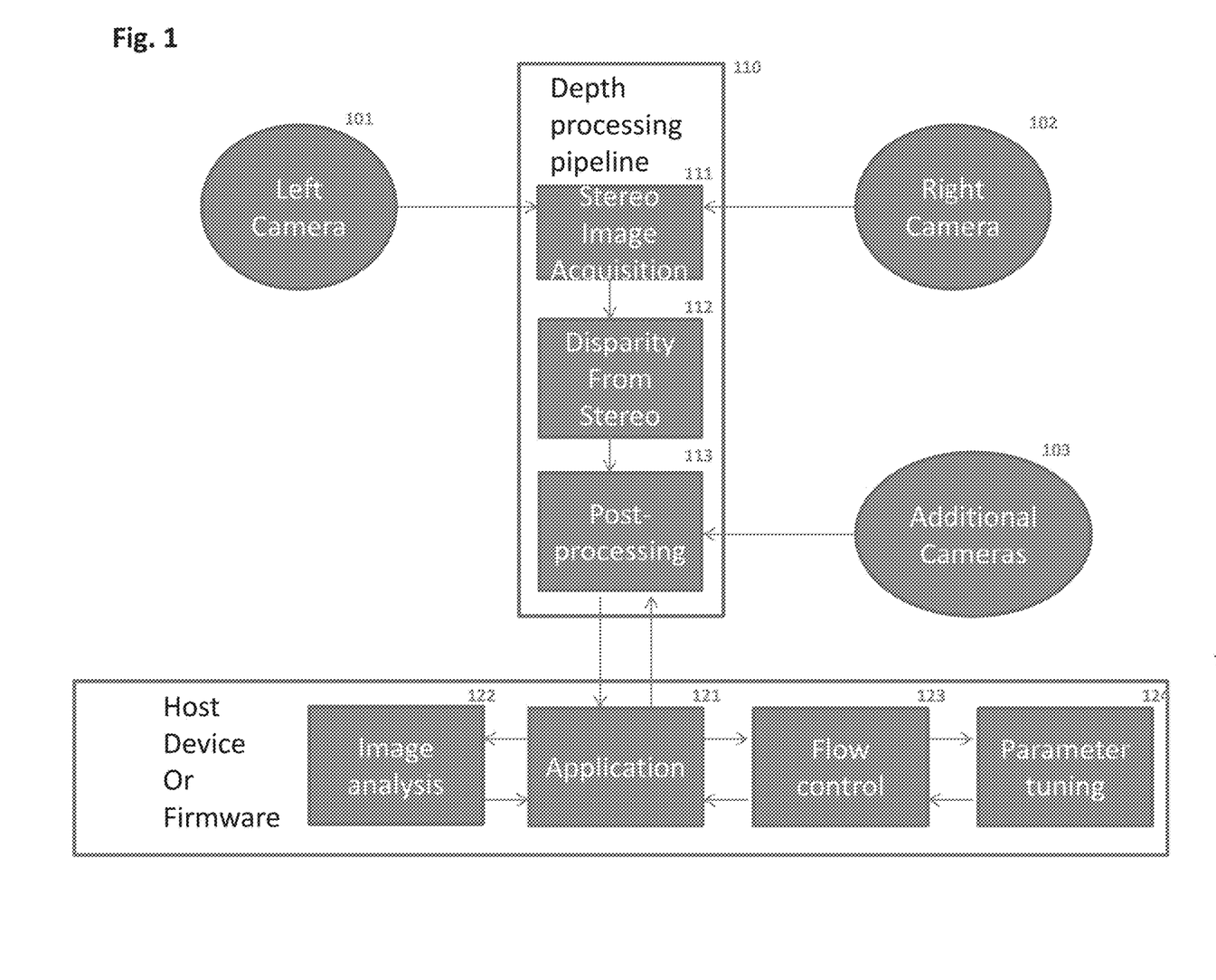
FIG. 1—illustrates an exemplary system construed according to an embodiment of the present invention.

FIG. 1 illustrates an exemplary system construed according to an embodiment of the present invention.

The system comprises cameras 101 and 102 which capture the same image with some displacement caused by a baseline shift between the images. A depth image is then generated by combining the stereo images captured by these two cameras.

Optionally, an additional camera 103 (such as a webcam) may be used to provide an RGB image at a higher resolution. This RGB image needs to be combined with the depth image obtained by combining the two stereo images, in order to obtain a 3D display.

Processing data in order to determine the applicable depth from the stereo images is carried out by a processor (referred to herein as depth processing pipeline 110), which may be implemented by using a Very-Large-Scale Integration ("VLSI") circuit or a Field-Programmable Gate Array ("FPGA"). It may generate disparity/or and depth related data as well as RGB data retrieved from the cameras' inputs. The depth processing pipeline is controlled by using registers and shadow registers set by the host device (or firmware) 120.

Stereo image acquisition block 111 may be implemented as a hardware pipeline performing any one or more of the following functions: sensor control, sensor synchronization, geometric distortion correction, illumination correction as well as other processing required for generating a reliable 3D stereo image out of the data retrieved from cameras 101 and 102.

Disparity from stereo block 112 may be implemented by a hardware pipeline performing operations required to generate disparity from a stereo image as will be further described in connection with FIG. 2.

Post processing block 123 may be implemented as a hardware for improving the disparity image and producing depth output. In some embodiments it may further include RGB related data received from the cameras.

Host device (or firmware) 120 is operative to control the depth processing pipeline 110 and to generate an output as required by the end user.

Application block 121 may execute various algorithms requested by the user, including face detection, skeleton tracking, hands tracking, gaze tracking, 3D object stitching, and the like.

Image analysis block 122 is operative to carry out one or more of the following functions: image segmentation, object detection and motion analysis.

Flow control block 123 is configured to carry out control of complex flows, using multiple heterogeneous frame acquisition.

Parameter tuning block 124 may include generation of specific registers and shadow registers values, as well as modifying software and firmware parameters for each consecutive frame.

Figure 2:
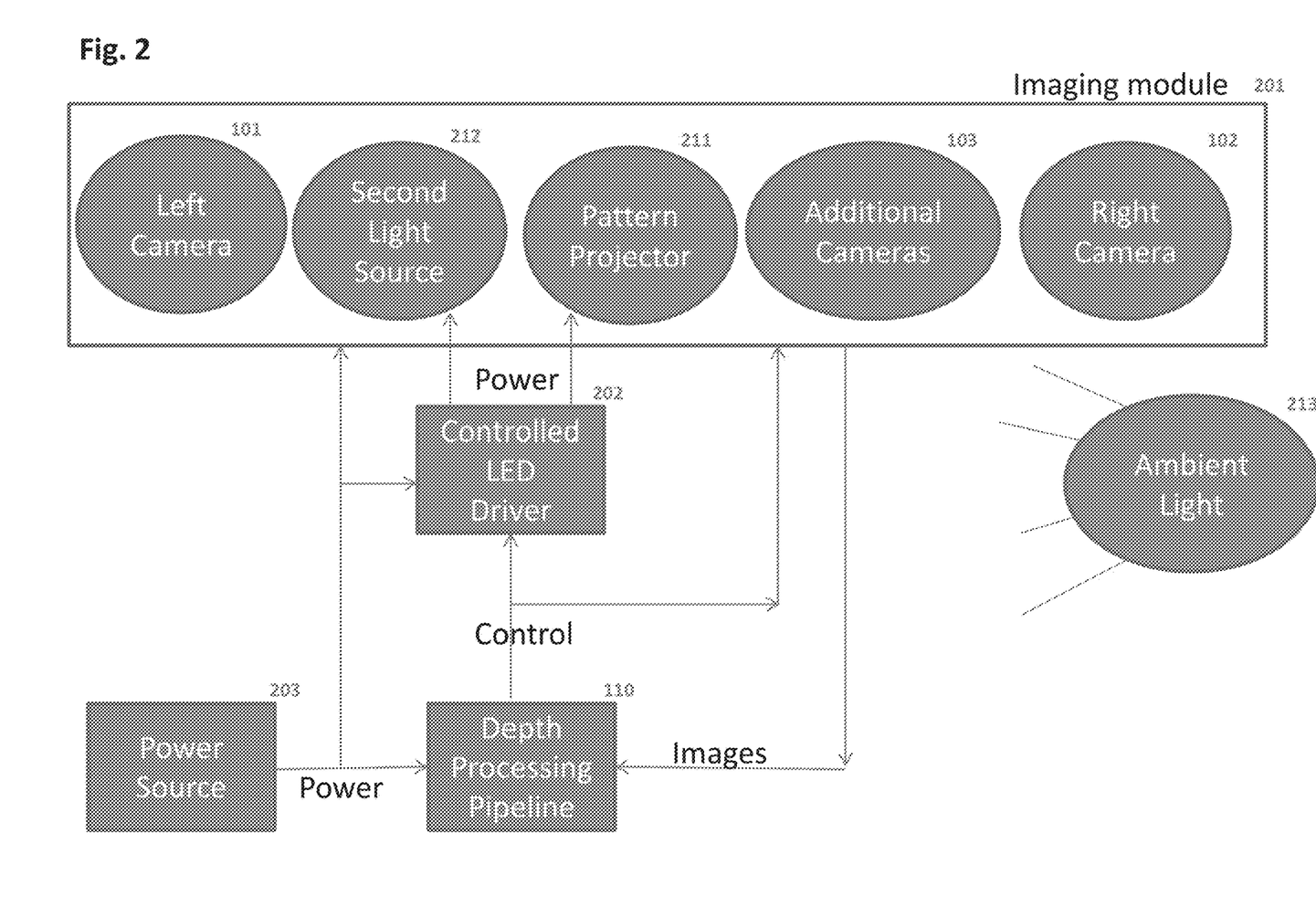
FIG. 2—exemplifies a block diagram of an imaging module.

FIG. 2 exemplifies a block diagram of imaging module 201. According to this example it is operative to receive data retrieved from the left (101) and right (102) cameras and the additional camera 103 (e.g. an RGB camera) depicted in FIG. 1. The imaging module may comprise a pattern projector 211, at least one second light source 212, where the latter may include a flood light LED or an additional pattern projector, or any other applicable cameras and light sources.

Pattern projector 211 and the at least one second light source 212 may receive electric power from a controlled LED driver 202. The depth processing pipeline 110 described in FIG. 1, may be configured to control the controlled LED driver 202 and the imaging module 201, based on images retrieved from cameras 101, 102 (and optionally 103).

Ambient light depicted as 213 in this FIG. 2, may be the outcome of solar radiation, lamp(s) illumination or of any other applicable external light source, as long as it is not controllable by the system of the present invention.

Power source 203 is used to supply power to all modules. The power source may be one which is configured to supply a pre-defined constant voltage, and/or has a maximal surge power and/or complies with a pre-defined average power threshold.

Figure 3:
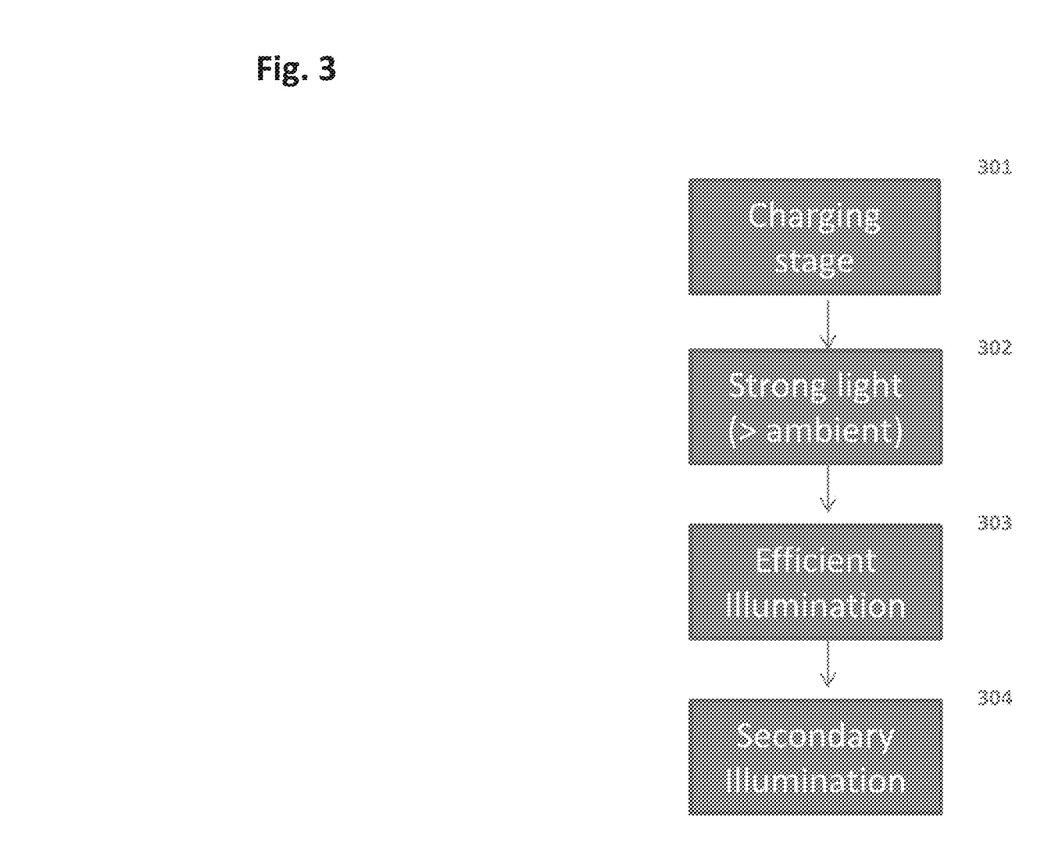
FIG. 3—illustrates a process of controlling a LED driver according to an embodiment of the invention.

FIG. 3 illustrates steps in the process of controlling the LED driver according to an embodiment of the invention, wherein the controlled LED driver 202 shown in FOG. 2, may change states during each frame acquisition. The steps according to this example are:

Step 301 (the charging step) takes place preferably when the light sources are not active and the internal capacitors are then charged. As will be appreciated by those skilled in the art, this charging step may be the longest step from among the steps depicted in FIG. 3.

Step 302 (designated in FIG. 3 as "strong light" step), takes place when the light emitted by the pattern projector 211 of FIG. 2 is of higher intensity (e.g. brighter) than the ambient light. The system may be less efficient during this step. The pattern may be used for stereo detection of walls and other large objects, where a pattern may be useful.

Step 303, efficient illumination step, takes place if the system is configured for obtaining a maximal efficiency in the presence of moderate or weak ambient light. This step may be carried out for example by modifying (increasing) exposure, the analog gain and the digital gain of the sensors.

In the secondary illumination step (step 304) of this example, the main pattern projector 211 is turned off, and a secondary light source 212 is applied. For example, when operating under high definition mode, a secondary pattern may project finer grid onto the target. In the absence of ambient light, a flood LED may be used to generate the flood light. The flood light may be used to enable distinguishing between bright and dark objects, between objects and shadows, to illuminate larger field of view than the field of view illuminated by pattern projector 211, or for any other applicable purpose. In some embodiments, the pattern projector may operate within the infrared range, while the secondary light source may be utilized to provide visible light (e.g. for the additional camera(s) 103).

Figure 4:
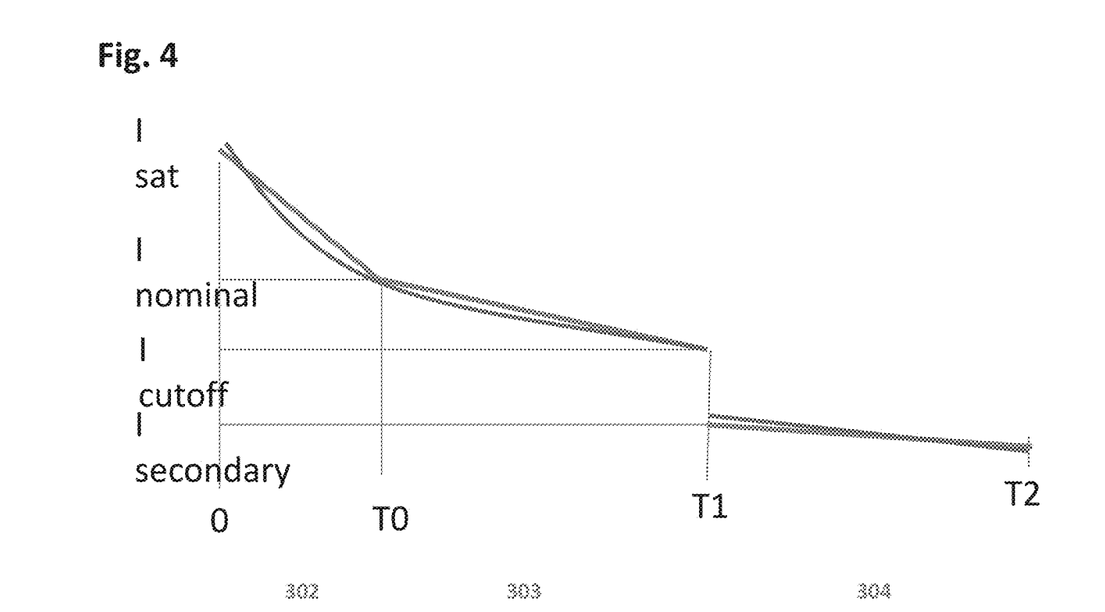
FIG. 4—exemplifies current output of the controlled LED driver of FIG. 2.

FIG. 4 exemplifies current output of the controlled LED driver (202), for the different steps described in FIG. 3, which in a way may be considered as being similar to a capacitor discharge.

The maximal current output of the controlled LED driver 202 should not be higher than the surge/saturation current of the pattern projector 211. During step 302 where the light emitted by the pattern projector 211 of FIG. 2 is of higher intensity than the ambient light, the light output may fall fast from the saturation current value where the light output of the pattern projector 211 has a maximal value to the nominal operation current characterized by high energy efficiency of the pattern projector 211.

In the efficient illumination step, 303, the current output of the controlled LED driver 202 is around the nominal current value and should not be below the cutoff current of the pattern projector 211.

In some embodiments, secondary light source 212 has a different value for the nominal current, a value which may be below the nominal current value of the pattern projector 211.

Figure 5:
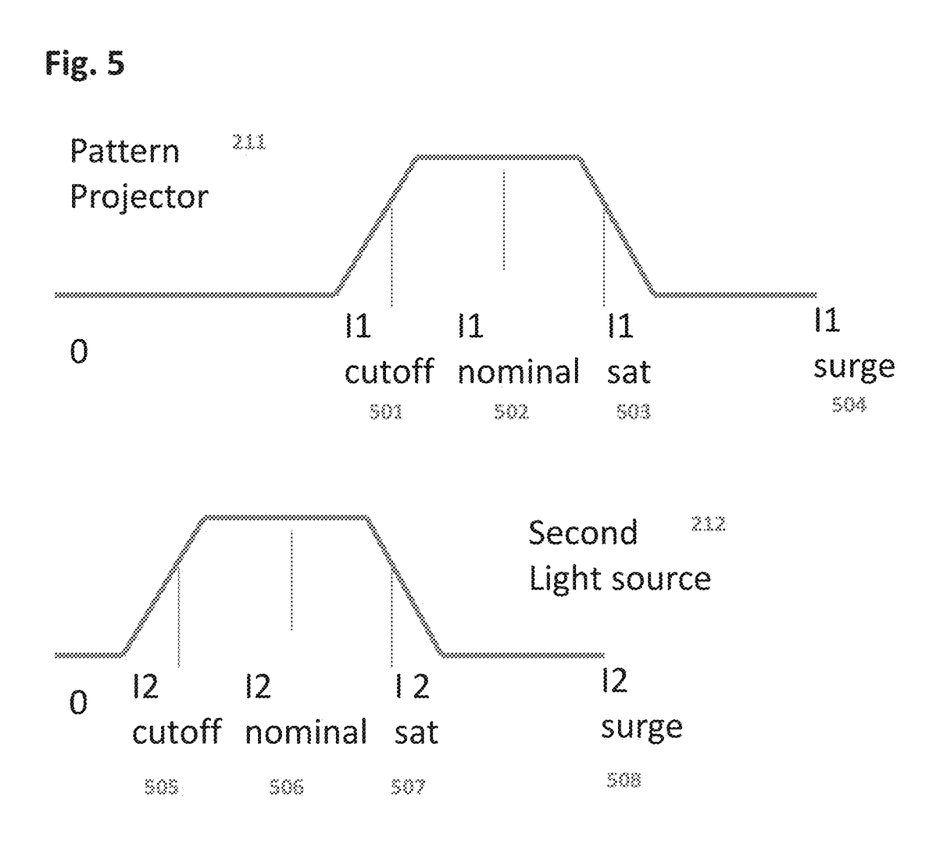
FIG. 5—illustrates a series of curves of current profiles for both the pattern projector and the secondary light source.

FIG. 5 illustrates a series of curves of current profiles for both the pattern projector and the secondary light source.

The pattern projector 211 may have cutoff current value 501 being the threshold value below which it is not efficient, nominal current 502 which is the current used for a long-term operation, saturation current 503 which is used for an efficient intense light operation, while the value of the surge current threshold, 504, is a value beyond which eye safety hazards or damage of certain components, might occur.

In a somewhat similar way, the secondary light source 212 may have a cutoff current value 505, a nominal current 506, a saturation current 507 and a surge current 508. It should be noted that the currents characterizing the operation of the secondary light source 212, may be in a different range than the currents characterizing the operation of the pattern projector 211.

Figure 6:
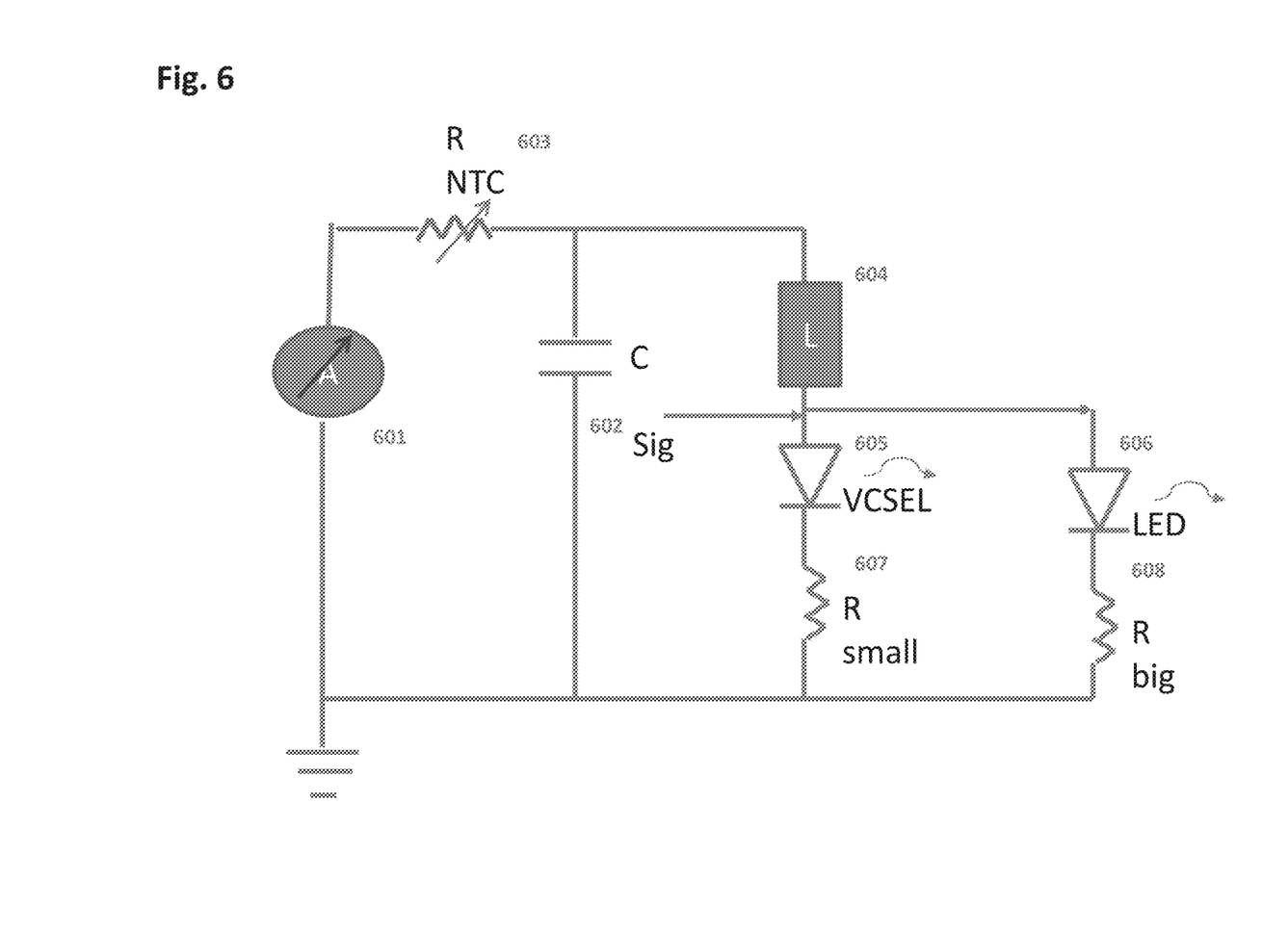
FIG. 6—represents a simple implementation of the controlled LED driver which utilizes a capacitor discharge to drive the power profile shown in FIG. 4.

Turning now to FIG. 6 which represents a simple implementation of the controlled LED driver 202 which utilizes a capacitor discharge to drive the power profile shown in FIG. 4. The actual implementation of the electric circuit may include additional elements such as an NPN transistor to drive the light sources, an operational amplifier to close feedback loops or other, more complex electric components.

A current limited source 601, such as USB connection or a DC power supply, may be used to charge a capacitor 602 via an NTC resistor 603. An NTC resistor may be selected so as to limit the current surge when the circuit is turned on. Capacitor 602 may comprise several capacitor elements with complementing capacity and ESR (equivalent series resistance). Low ESR large capacity elements may be expensive, so they may be replaced for example by using multiple high ESR large capacity and low ESR low capacity elements.

A signal from the depth processing pipeline (110) may be used to activate the pattern projector 211, the second light source 212 and cameras 101, 102 and 103 (if used). Preferably, the operation of the light sources and the cameras are synchronized in order to achieve an improved efficiency.

Once a light source is activated, capacitor 602 begins its discharge while powering the respective light source. If pattern projector 211, implemented for example by using an array of vertical-cavity surface-emitting laser (VCSEL) 605, is activated, the capacitor 602 discharges via inductive element 604 and a low value resistor 607. The resistance of resistor 607 may be tuned to the ESR of VCSEL 605, while taking into account the required discharge time of capacitor 602. The inducting element 604 may be used to limit the current of the capacitor discharge below the surge current of the VCSEL array 605.

When the secondary light source 212, implemented for example by LED 606, is activated, the capacitor 602 discharges through a different resistor (possibly one having a larger resistance) 608, providing currents that are suitable for the LED 606 operation.

In cases where both VCSEL array 605 and LED 606 are both activated, the LED 606 preferably emits its light only after the VCSEL array 605 has ceased to emit light, e.g. when current cutoff conditions occurred.

Figure 7:
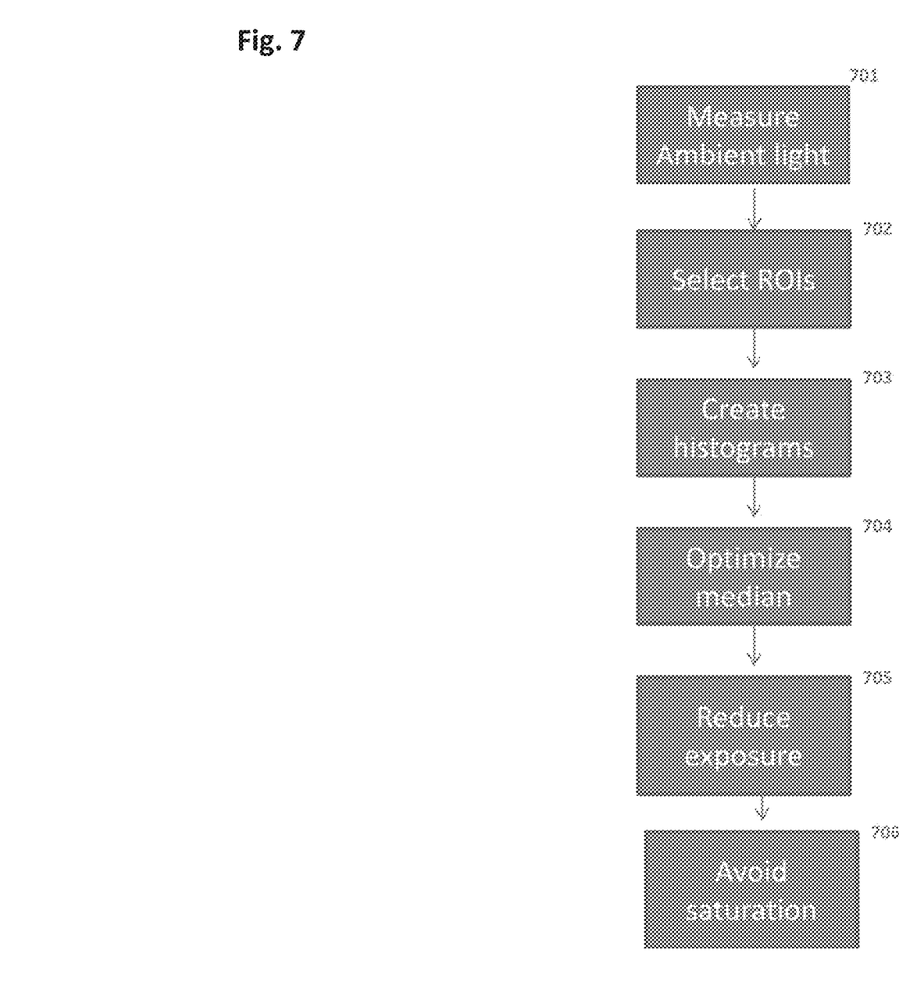
FIG. 7—exemplifies a method for implementing an exposure control by depth processing pipeline, according to an embodiment of the invention.

FIG. 7 exemplifies a series of steps for implementing an exposure control technique by depth processing pipeline 110, according to an embodiment of the invention.

In step 701, the system measures the ambient light, such a measurement may be done for example by turning off light sources 211 and 212 during a dedicated frame. The average grayscale levels detected at the image taken by a camera when light sources 211 and 212 are turned off, may be used as indicators for the intensity of the ambient light.

Next, in step 702, ROIs (regions of interest) are selected on the grayscale image, in order to perform the intensity evaluation. In some embodiments, the FOV (field of view) of light sources 211 and 212 may be different from each other and the illumination intensity may vary within the respective FOVs. Therefore, instead of taking the full image into account, the exposure control mechanism may be activated for certain selected areas of the image.

In step 703, histograms of the grayscale values within the ROI, are generated. The histograms preferably provide the median, the top percentile and the bottom percentile of the grayscale levels as well as other suitable information.

The term "percentile" is used herein denotes a measure used in statistics indicating the value below which a given percentage of observations in a group of observations fall. For example, the tenth percentile is the value (or score) below which 10 percent of the observations may be found.

In step 704, the change in exposure required to optimize median grayscale level, is calculated. Optionally, the desired median grayscale level is roughly at the middle of the dynamic range of the system.

Next, the exposure level is reduced (step 705) in order to improve the system power consumption and to provide light which is more intense than the ambient light. Preferably, the system performance (depth accuracy, noise, resolution, etc.) does not change much within a large part of the dynamic range, so that the exposure may be reduced accordingly. The lower percentile of the gray levels may be observed in order to minimize degradation of the system performance.

In some embodiments, object proximity and eye safety considerations may also be taken into account when determining the reduction in the exposure.

In step 706 the top gray levels percentile is monitored and the exposure may be further reduced in order to avoid reaching a saturation state.

Figure 8:
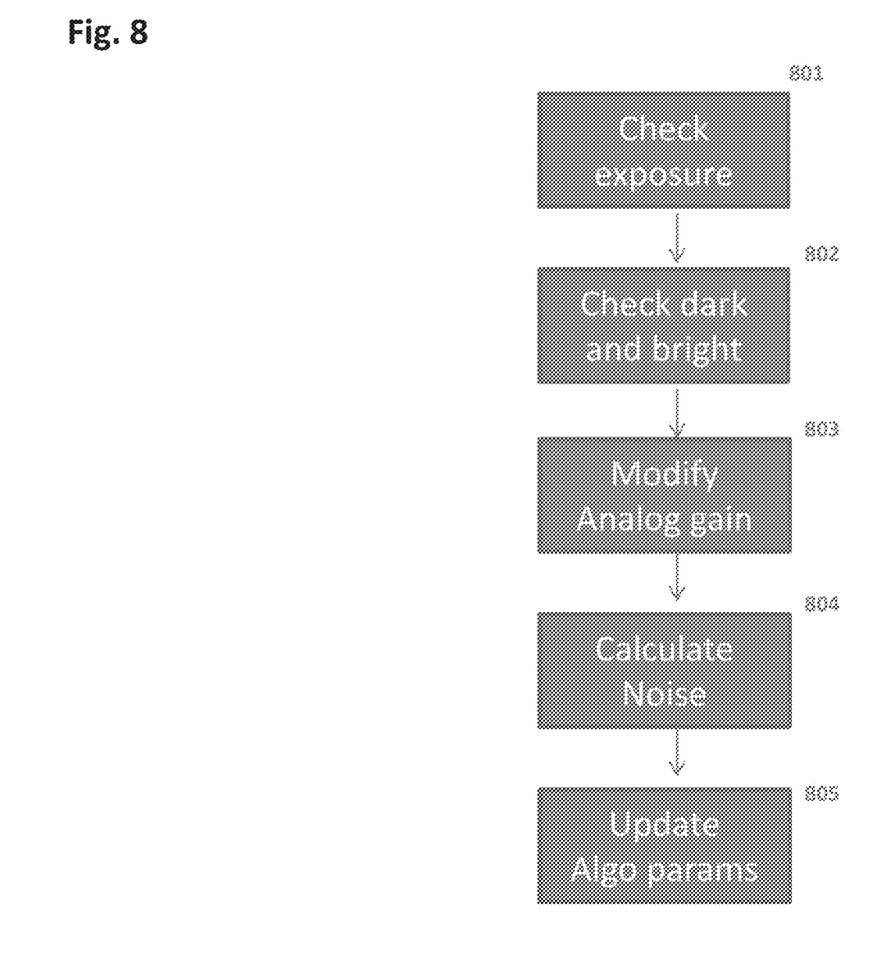
FIG. 8—illustrates a method for controlling an analog gain implemented according to an embodiment of the invention.

FIG. 8 illustrates steps of a method for controlling an analog gain implemented according to an embodiment of the invention by depth processing pipeline 110.

In step 801, the exposure is checked. Optionally, the analog gain control is activated only when the exposure control reaches a maximal exposure level.

In step 802, dark and bright gray level percentile are evaluated, in order to enable calculating the required modification of the analog gain.

Next, the analog gain is modified (step 803) in order to provide improved (preferably the best) gray levels for the depth processing pipeline 110.

Noise resulting from new (modified) analog gain is then calculated in step 804, and the algorithmic parameters are updated (step 805) to enable achieving the best depth processing available under the given noise conditions. For example, using larger areas for aggregation computation.

Figure 9:
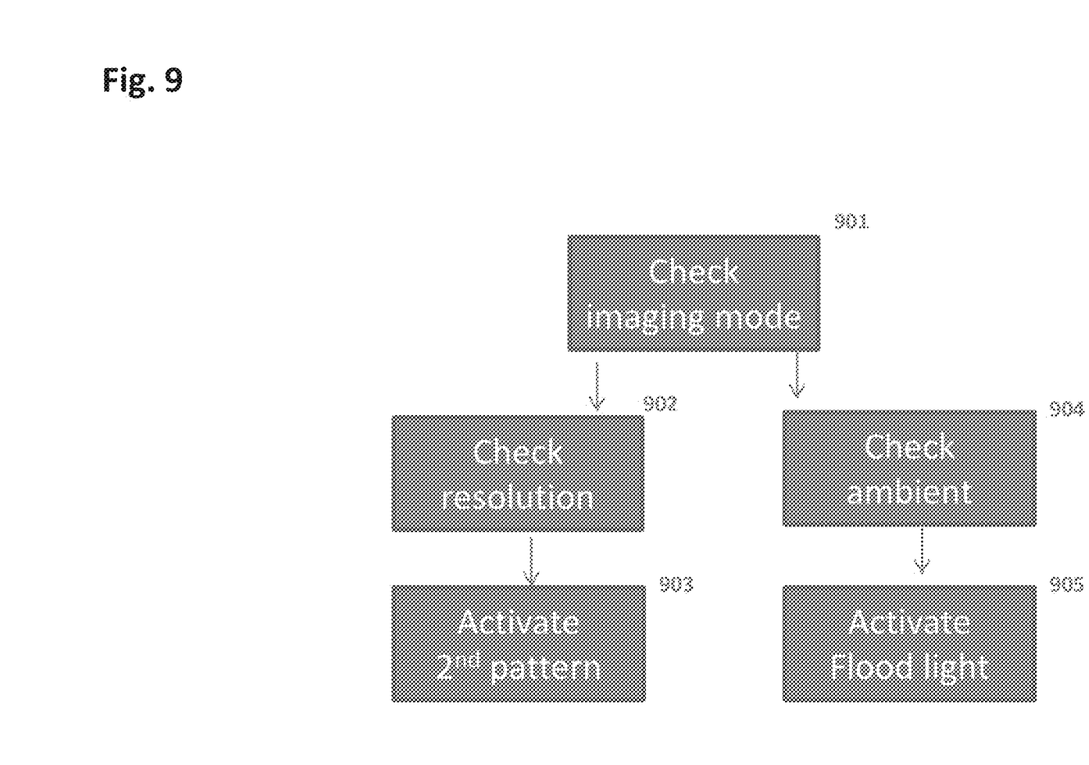
FIG. 9—illustrates a method for controlling the exposure of a secondary light source, implemented according to an embodiment of the invention.

FIG. 9 illustrates steps of a method for controlling the exposure of a secondary light source, implemented according to an embodiment of the invention by depth processing pipeline 110.

First, imaging mode is checked in order to verify whether the exposure signal is conveyed to the pattern projector 211, or to the secondary light source 212, or to both (step 901).

Then, the system resolution is checked (step 902) and a secondary, finer pattern is activated (step 903) if the mode of high resolution is configured. Ambient light is then checked (step 904) and the flood light of the LED or the RGB illumination is activated in case it has been determined that the ambient light is low.

Figure 10:
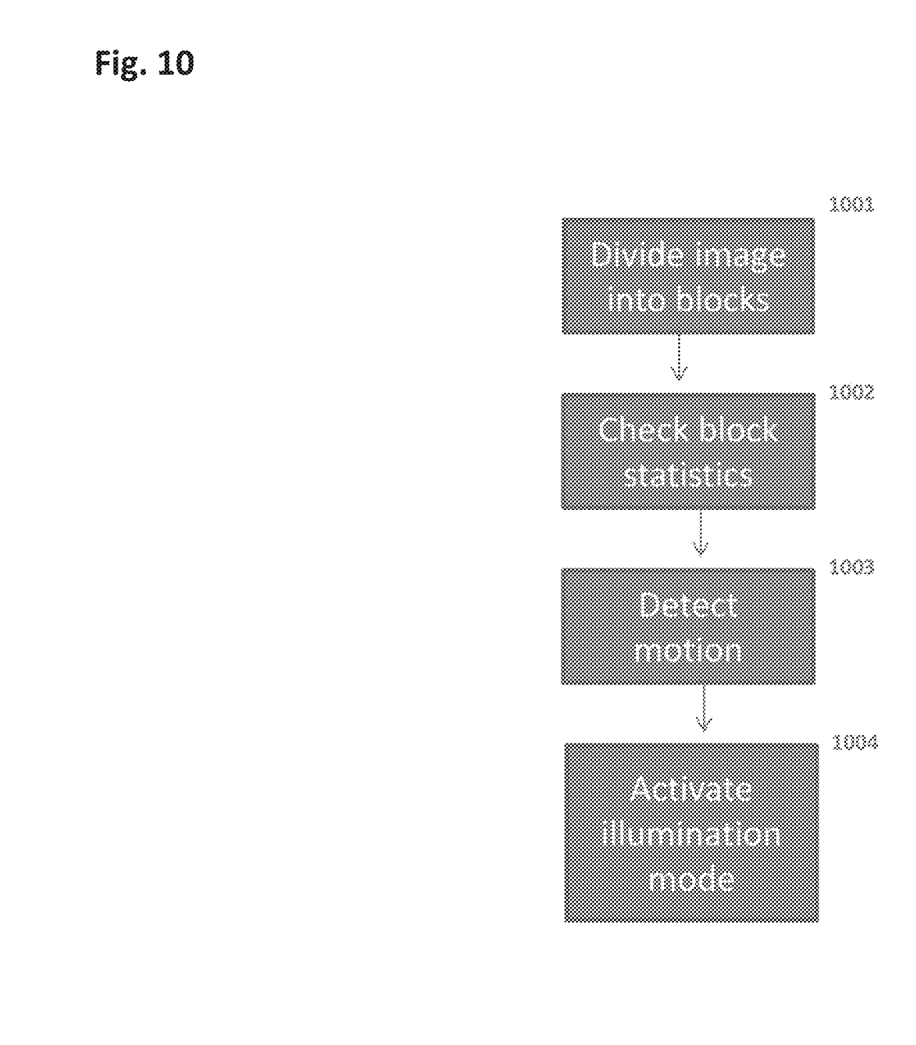
FIG. 10—demonstrates steps of a method for controlling motion in imaging mode, implemented according to an embodiment of the invention.

FIG. 10 demonstrates steps of a method for controlling motion in imaging mode, implemented according to an embodiment of the invention by depth processing pipeline 110. The method comprises the steps of:

Dividing the image into a plurality of blocks (step 1001).

For each of the blocks, calculating block statistics and determining if the block statistics matches the block statistics of previous frame(s) (step 1002).

Detecting if a motion took place between frames, by analyzing discrepancies in block statistics (step 1003).

Activating the illumination mode, based on the determination made on the system motion (step 1004).

It should be noted that the motion detection mechanism demonstrated above may be performed by using data retrieved from left camera 101 or from the right camera 102. In addition or in the alternative, it may be performed by using data retrieved from the additional camera(s) 103.

The following description provides further elaborations on certain aspects of the examples described hereinbefore.

According to an embodiment of the system provided by the present invention several algorithms may be activated independently of each other and the results obtained from the different algorithms may then be processed in order to improve the end result.

Following are some exemplified algorithms that may be activated independently of each other:
1. Histogram computation over disparity, left image or right image in a set of regions of interest;
2. Exposure control based on statistics of left image or the right image.
3. Selected statistics computations over separate tiles of an image, including mean values, standard deviations, minimum values, maximum values, median value, etc.
4. A/B mode switching between a mode with projected pattern and depth computation and an ambient-driven mode with a dedicated computer vision processing. Let us now consider in more details some of the modes described:

Ambient-Driven Mode:
1. In ambient-driven mode no pattern is projected.
2. Image statistics computation includes ROI histogram computation and selected tile statistics for the left and right images.
3. The current image statistics is compared with the statistics of the preceding frame and the statistics of the first frame after deactivation of projector-driven mode. If the change in statistics between frames or the aggregated statistics drift is above a pre-defined threshold, the projector-driven mode would be activated.
4. Optionally, if a change has been detected, an enhanced ambient-driven mode may be activated. For example, image resolution and frame rate may be increased without turning on the projector.

Projector-Driven Mode:

In this mode, a pattern is projected and depth processing is performed.

Statistical data may be collected for determining disparity and/or the depth map.

A comparison may be conducted between depth statistics or the statistics of left and right images, of different frames. If the statistical data is not significantly different between frames, a statistical data aggregation algorithm may be activated. The statistical data aggregation algorithm compares the statistics of each frame not only to the current frame but also to the first frame for which the aggregation algorithm has begun collecting the statistical data.

If a substantial change has been noted in the statistical data collected or in the aggregated statistical data, the statistical aggregation algorithm is deactivated. However, if there has been no substantial change in the statistical data collected or in the aggregated statistical data for a pre-defined number of frames, the ambient-driven mode may be activated (or re-activated) while the projector-driven mode is deactivated.

When the projector-driven mode is deactivated, the user may receive the last valid depth frame.

Optionally, activation or deactivation of the projector mode is region-of-interest specific. In other words, the depth of the projected image is calculated over a certain region of interest.

Also, the system of the present invention may be configured to use a reduced projector-driven mode, i.e. a mode characterized in a lower frame rate, a lower resolution or a lower exposure.

Alternating Imaging Mode:

While operating under a full alternating imaging mode, both projector mode image and ambient-driven image are collected with certain time sharing between them. The ambient-driven imaging may switch to an advanced mode having higher capabilities which is based on motion detection. Projector-driven imaging may on the other hand, switch to a reduced mode with lower capabilities based on motion detection.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention in any way. For example, the apparatus may include a cameras' array that has two or more cameras, such as, for example, video cameras to capture two or more video streams of the target. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

The invention claimed is:

1. A method for generating a three-dimensional image, comprising the steps of:
measuring a current intensity of ambient light at a target to identify a set of intensity indicators associated with a plurality of regions of interest;
selecting a portion of the plurality of regions of interest to perform an intensity evaluation;
determining a desired illumination intensity for illuminating the target based on the intensity evaluation of the ambient light at the selected portion of regions of interest, wherein the desired illumination intensity is greater than the current intensity of the ambient light;

illuminating the target at the determined illumination intensity capturing an image that comprises one or more objects present at the selected portion of regions of interest;

converting the captured image into data;

processing the data received from the conversion of the captured image;

determining depth of at least one of the one or more objects present at the region of interest being a part of said illuminated target; and generating a three dimensional image of the at least one of the one or more objects whose depth has been determined.

2. The method of claim 1, wherein the step of illuminating the target comprises projecting light at a pre-defined pattern onto the target.

3. The method of claim 2, wherein the projected light is emitted from a Vertical-Cavity Surface-Emitting Laser (VCSEL) array and its pattern is formed by at least one diffractive optical element.

4. The method of claim 1, wherein the image of the one or more objects comprised in the illuminated target is captured by at least one depth capturing sensor and at least one RGB sensor, and wherein the step of processing comprises processing data retrieved from the at least two sensors.

5. The method of claim 1, further comprising a step of capturing at least one other image of the one or more objects associated with a preceding three dimensional image, and determining whether a change had occurred to said one or more objects within a period of time extending between the time at which the first image was captured and the time at which the at least one other image was captured.

6. The method of claim 1, further comprising a step of retrieving audio information present at the target location.

7. The method of claim 6, further comprising determining a movement of at least one of the one or more objects whose depth has been determined, by combining information derived from at least two captured images and said audio information.

8. An apparatus configured to provide a three-dimensional image of at least one object, the apparatus comprising:

a sensor configured to measure a current intensity of ambient light at a target;

a projector configured to illuminate the target where the at least one object is present, wherein the projector's illumination intensity is determined based on the current intensity of ambient light at the target;

at least one image capturing sensor, configured to capture an image that comprises the at least one object, by retrieving light reflected from the at least one object; and at least one processor configured to:

measure a current intensity of ambient light at the target to identify a set of intensity indicators associated with a plurality of regions of interest;

select a portion of the plurality of regions of interest to perform an intensity evaluation;

determine a desired illumination intensity for illuminating the target, based on intensity evaluation of the ambient light at the selected portion of regions of interest wherein the desired illumination intensity is greater than the current intensity of the ambient light; and process data retrieved from the image captured by the at least one image capturing sensor and to generate a three-dimensional image that comprises the at least one object.

9. The apparatus of claim 8, wherein said projector comprises a Vertical-Cavity Surface-Emitting Laser (VCSEL) array.

10. The apparatus of claim 8, wherein said apparatus further comprises a diffractive optical element for providing a pre-defined pattern of light emitted from the projector.

11. The apparatus of claim 8, wherein the pre-defined pattern is a pattern that enables carrying out a three-dimensional imaging of the at least one object.

12. The apparatus of claim 8, wherein the apparatus comprises at least one depth capturing sensor and at least one RGB sensor, and wherein the processor is configured to process data retrieved from the at least two sensors for generating the three- dimensional image.

13. The apparatus of claim 8, further comprising a microphone configured to capture audio information present at the target location.

14. The method of claim 1, wherein the illumination intensity is changed between capturing two consecutive images.

15. A method for generating a three-dimensional image, comprising the steps of:

measuring a current intensity of ambient light at a target to identify a set of intensity indicators associated with a plurality of regions of interest;

selecting a portion of the plurality of regions of interest to perform an intensity evaluation;

determining a desired illumination intensity for illuminating the target, based on the intensity evaluation of the ambient light at the selected portion of regions of interest, wherein the desired illumination intensity is greater than the current intensity of the ambient light;

illuminating the target by exposing it to visible light at the determined illumination intensity;

capturing an image that comprises one or more objects present at the illuminated target;

converting the captured image into data;

processing the data received from the conversion of the captured image;

determining depth of at least one of the one or more objects present at the illuminated target; and generating a three-dimensional image of the at least one of the one or more objects whose depth has been determined.

16. The method of claim 1, wherein the measurements of the current intensity of ambient light at the target is done by turning off an associated light source for a dedicated time frame.

* * * * *